(12) United States Patent
Son

(10) Patent No.: US 9,478,281 B2
(45) Date of Patent: Oct. 25, 2016

(54) VARIABLE RESISTANCE MEMORY APPARATUS, MANUFACTURING METHOD THEREOF

(71) Applicant: SK hynix Inc., Gyeonggi-do (KR)

(72) Inventor: Min Seok Son, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 220 days.

(21) Appl. No.: 14/151,565

(22) Filed: Jan. 9, 2014

(65) Prior Publication Data

US 2015/0103588 A1    Apr. 16, 2015

(30) Foreign Application Priority Data

Oct. 15, 2013  (KR) .................. 10-2013-0122543

(51) Int. Cl.
| G11C 11/00 | (2006.01) |
| G11C 13/00 | (2006.01) |
| G11C 11/56 | (2006.01) |
| H01L 45/00 | (2006.01) |
| H01L 27/24 | (2006.01) |

(52) U.S. Cl.
CPC ....... *G11C 13/0004* (2013.01); *G11C 11/5678* (2013.01); *H01L 27/2409* (2013.01); *H01L 45/06* (2013.01); *H01L 45/1675* (2013.01); *H01L 45/1683* (2013.01); *G11C 2213/50* (2013.01); *G11C 2213/72* (2013.01)

(58) Field of Classification Search
USPC ......................................... 365/163
See application file for complete search history.

(56) References Cited

U.S. PATENT DOCUMENTS

| 7,820,996 B2* | 10/2010 | Lee | ............... H01L 45/1616 257/2 |
| 8,299,450 B2* | 10/2012 | Ahn | ............... H01L 27/2436 257/2 |
| 8,933,430 B1* | 1/2015 | Jung | ............... H01L 45/1683 257/295 |
| 2006/0209495 A1* | 9/2006 | Lee | ............... G11C 11/56 361/502 |
| 2010/0193916 A1* | 8/2010 | Xu | ............... H01L 21/0337 257/618 |
| 2011/0199833 A1* | 8/2011 | Shim | ............... G11C 16/0483 365/185.23 |
| 2012/0100706 A1* | 4/2012 | Sim | ............... H01L 27/11531 438/591 |
| 2012/0119181 A1* | 5/2012 | Oh | ............... H01L 45/04 257/4 |
| 2012/0281452 A1* | 11/2012 | Huo | ............... H01L 27/2463 365/148 |
| 2012/0305522 A1* | 12/2012 | Park | ............... H01L 45/06 216/13 |
| 2013/0223124 A1* | 8/2013 | Park | ............... H01L 27/2409 365/96 |
| 2014/0077303 A1* | 3/2014 | Baek | ............... G06F 17/5063 257/365 |

(Continued)

FOREIGN PATENT DOCUMENTS

| KR | 100819560 | 4/2008 |
| KR | 101027787 | 4/2011 |

*Primary Examiner* — Huan Hoang
*Assistant Examiner* — Pablo Huerta
(74) *Attorney, Agent, or Firm* — IP & T Group LLP

(57) ABSTRACT

A variable resistance memory apparatus and a method of manufacturing the same are provided. The variable resistance memory apparatus includes a plurality of memory cells. Each of the memory cells includes a plurality of data storage regions. The plurality of data storage regions have different widths from each other.

12 Claims, 5 Drawing Sheets

(56) References Cited

U.S. PATENT DOCUMENTS

| | | | | |
|---|---|---|---|---|
| 2014/0084358 A1* | 3/2014 | Lee | H01L 27/11582 | 257/324 |
| 2014/0166965 A1* | 6/2014 | Seo | H01L 45/124 | 257/4 |
| 2014/0254256 A1* | 9/2014 | Choi | H01L 45/1206 | 365/163 |
| 2015/0024587 A1* | 1/2015 | Kim | H01L 27/11548 | 438/618 |
| 2015/0028425 A1* | 1/2015 | Kim | H01L 29/66477 | 257/379 |
| 2015/0069551 A1* | 3/2015 | Toko | H01L 43/12 | 257/421 |
| 2015/0118821 A1* | 4/2015 | Millward | H01L 28/40 | 438/386 |
| 2015/0146487 A1* | 5/2015 | Jung | G11C 16/14 | 365/185.11 |
| 2015/0243708 A1* | 8/2015 | Ravasio | H01L 27/2463 | 257/4 |
| 2015/0249113 A1* | 9/2015 | Takagi | H01L 45/1233 | 257/5 |

* cited by examiner

VARIABLE RESISTANCE MEMORY APPARATUS, MANUFACTURING METHOD THEREOF

CROSS-REFERENCES TO RELATED APPLICATION

This application claims priority under 35 U.S.C. 119(a) to Korean application No. 10-2013-0122543, filed on Oct. 15, 2013, in the Korean intellectual property Office, which is incorporated by reference in its entirety.

BACKGROUND

1. Technical Field

Various embodiments of the inventive concept relate to a variable resistance memory apparatus, more particularly, to a variable resistance memory apparatus having a multi-level cell, and a manufacturing method thereof.

2. Related Art

In recent years, with demands on semiconductor memory apparatuses with high performance and low power, next generation semiconductor memory apparatuses with non-volatility and non-refresh have been researched. As one of the next generation semiconductor memory apparatuses, variable resistance memory apparatuses are suggested, and typical examples of the variable resistance memory apparatuses are phase-change random access memory apparatuses (PCRAMs), resistive RAMs (ReRAMs), magnetic RAMs (MRAMs), spin-transfer torque magnetoresistive RAMs (STTMRAMs), or polymer RAMs (PoRAMs).

A cell pitch or an area occupying by one cell is reduced to accomplish high integration in recent variable resistance memory apparatuses.

However, the process of reducing the cell pitch or the cell area to accomplish the high integration may be difficult, and electrical characteristics or reliability of the variable resistance memory apparatus are degraded due to a void formed in a data storage unit during the process.

Therefore, it may be necessary to introduce a multi-level cell that may store multi-bits in one memory cell, to implement a variable resistance memory apparatus with high integration and large capacity.

SUMMARY

Various exemplary embodiments of the inventive concept are directed to a variable resistance memory apparatus with high integration and large capacity through implementation of a multi-level cell, and a manufacturing method thereof.

According to an exemplary embodiment of the inventive concept, there is provided a variable resistance memory apparatus. The variable resistance memory apparatus may include a plurality of memory cells, each of the memory cells including a plurality of data storage regions. The plurality of data storage regions may have different widths from each other.

According to another exemplary embodiment of the inventive concept, there is provided a variable resistance memory apparatus. The variable resistance memory apparatus may include a plurality of memory cells. Any one of the memory cells includes a switching device formed on a semiconductor substrate, a plurality of first electrodes formed on the switching device and having different heights from each other, a plurality of data storage units formed on respective first electrodes and having different heights from each other, and a plurality of second electrodes formed on respective data storage units and having different heights from each other.

According to still another exemplary embodiment of the inventive concept, there is provided a variable resistance memory apparatus. The variable resistance memory apparatus may include a memory cell array including a plurality of memory cells, each of the memory cells including a plurality of data storage regions having different widths from each other, and a control circuit suitable for controlling data to be input to or output from each of the memory cells according to a command input from outside.

According to still another exemplary embodiment of the inventive concept, there is provided a method of manufacturing a variable resistance memory apparatus. The method may include forming a switching device on a semiconductor substrate, forming an insulating layer on the switching device, forming a plurality of holes corresponding to a plurality of data storage regions by etching the insulating layer, the holes having different widths from each other and exposing an upper surface of the switching device, forming a plurality of first electrodes on bottoms of respective holes, forming a plurality of data storage units on respective first electrodes, and forming a plurality of second electrodes on respective data storage units.

These and other features, aspects, and embodiments are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
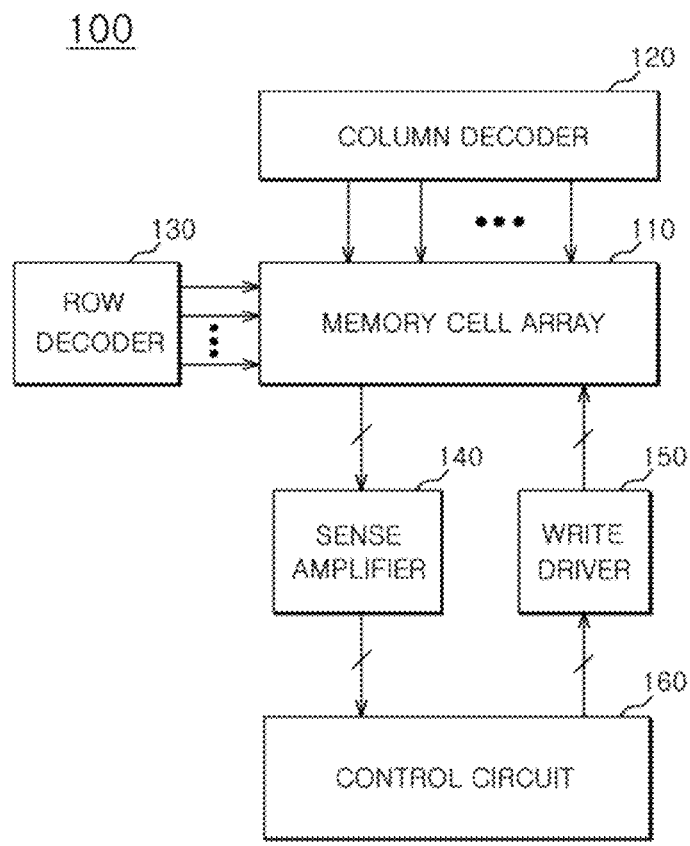
FIG. 1 is a block diagram illustrating a partial configuration of a variable resistance memory apparatus according to an embodiment of the inventive concept.

Hereinafter, exemplary embodiments will be described in greater detail with reference to the accompanying drawings.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present. It is also noted that in this specification, "connected/coupled" refers to one component not only directly coupling another component but also indirectly coupling another component through an intermediate component. In addition, a singular form may include a plural form as long as it is not specifically mentioned in a sentence.

Although a few embodiments of the inventive concept will be shown and described, it will be appreciated by those of ordinary skill in the art that changes may be made in these exemplary embodiments without departing from the principles and spirit of the inventive concept.

Figure 2:
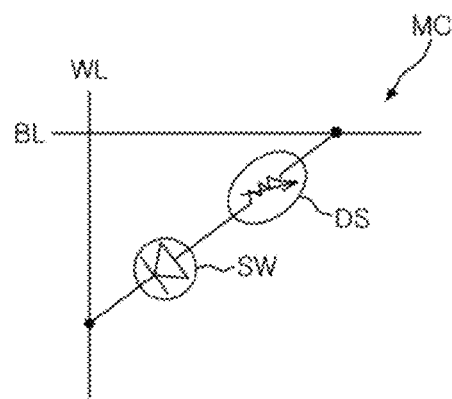
FIG. 2 is an equivalent circuit diagram illustrating a structure of a memory cell of a variable resistance memory apparatus according to an embodiment of the inventive concept.

FIG. 1 is a block diagram illustrating a partial configuration of a variable resistance memory apparatus according to an embodiment of the inventive concept, and FIG. 2 is an equivalent circuit diagram illustrating a structure of a memory cell of a variable resistance memory apparatus according to an embodiment of the inventive concept.

Referring to FIG. 1, a variable resistance memory apparatus 100 according to an embodiment of the inventive concept may include a memory cell array 110, a column decoder 120, a row decoder 130, a sense amplifier 140, a write driver 150, and a control circuit 160.

The memory cell array 110 may include a plurality of memory cells MC that may store data input from the outside. Here, one memory cell MC in the variable resistance memory apparatus 100 according to an embodiment of the inventive concept may be a multi-level cell having data storage regions that may store two pieces of data or more. The memory cell MC of the variable resistance memory apparatus according to an embodiment of the inventive concept will be described in detail with reference to FIG. 2 illustrating a structure of one memory cell group. One memory cell MC may include a data storage unit DS that may store two pieces of data or more and a switching device SW connected in series to the data storage unit DS. Here, the data storage unit DS may include a variable resistance material. The structure of the memory cell MC of the variable resistance memory apparatus 100 according to an embodiment of the inventive concept will be described in detail later.

The column decoder 120 receives a column address, and decodes the column address to designate a column of a plurality of memory cells MC to be read or written.

The row decoder 130 receives a row address and decodes the row address to designate a row of the plurality of memory cells MC to be read or written.

The sense amplifier 140 verifies whether or not a resistance value of a memory cell is within a preset resistance window, and it provides a verified result to the control circuit 160.

The write driver 150 provides a write current for storing data in the plurality of memory cells MC, and increases or reduces an amount of the write current in response to a control signal provided from the control circuit 160.

The control circuit 160 controls two pieces of data or more to be stored in one memory cell MC, and provides the control signal for increasing or reducing the amount of the write current, according to the verified result of the sense amplifier 140, to the write driver 150.

Figure 3:
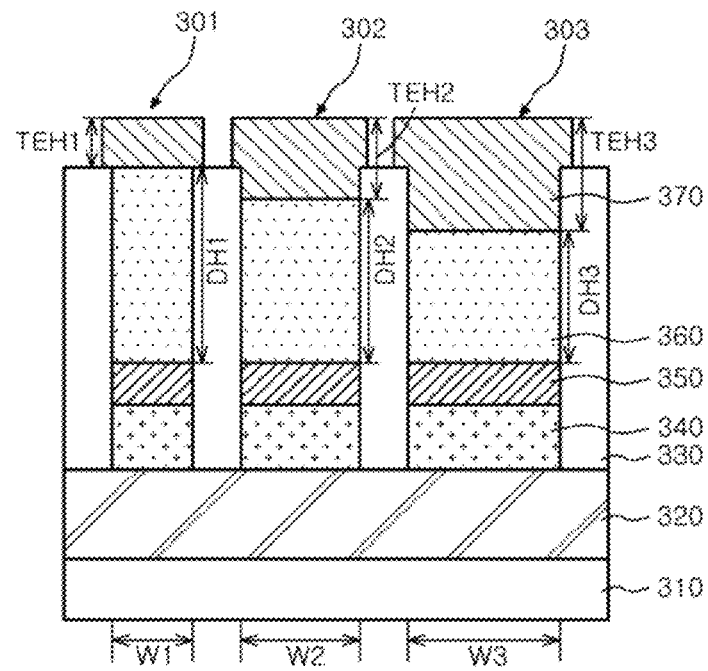
FIG. 3 is a cross-sectional view illustrating a structure of a memory cell of a variable resistance memory apparatus according to an embodiment of the inventive concept.

FIG. 3 is a cross-sectional view illustrating a structure of a memory cell of a variable resistance memory apparatus according to an embodiment of the inventive concept.

Referring to FIG. 3, a memory cell MC of a variable resistance memory apparatus 100 according to an embodiment of the inventive concept may include a plurality of data storage regions. For example, the memory cell MC may include a first data storage region 301, a second data storage region 302, and a third data storage region 303. Although the embodiment is described with one memory cell that includes three data storage regions, the inventive concept is not limited thereto. If necessary, the number of data storage regions included in the one memory cell may be controlled to have different value.

The data storage regions 301, 302, and 303 constituting the memory cell MC of the variable resistance memory apparatus 100 according to an embodiment of the inventive concept may have different widths from each other. In an exemplary embodiment, the data storage regions 301, 302, and 303 may be formed so that a width W1 of the first data storage region 301, and a width W2 of the second data storage region 302, and a width W3 of the third data storage region 303 become W1<W2<W3.

Each of the data storage regions 301, 302, and 303 may include a word line region 320 that may be formed on a semiconductor substrate 310 to serve as a word line, a switching device 340 (SW) formed on the word line region 320, a first electrode 350 formed on the switching device 340, a data storage unit 360 formed on the first electrode 350, a second electrode 370 formed on the data storage unit 360. The reference numeral 330 denotes an insulating layer. Here, in the first data storage region 301, the second storage region 302, and the third storage region 303, the data storage units 360 and the second electrodes 370 may be formed to have different heights from each other. For example, referring to FIG. 3, the data storage units 360 may be formed so that a height DH1 of the data storage unit 360 of the first data storage region 301, a height DH2 of the data storage unit 360 of the second data storage region 302, and a height DH3 of the data storage unit 360 of the third data storage region 303 become DH1>DH2>DH3. According to the data storage units 360 having the different heights from each other in the data storage regions 301, 302, and 303, the second electrodes 370 may be formed so that a height TEH1 of the second electrode 370 of the first data storage region 301, a height TEH2 of the second electrode 370 of the second data storage region 302, and a height TEH3 of the second electrode 370 of the third data storage region 303 become TEH1<TEH2<TEH3. Here, the data storage units 360 may be formed of a phase-change material, and the phase-change material may be, for example, germanium (Ga)-antimony (Sb)-tellurium (Te) (GST). In this embodiment, widths of the data storage regions 301, 302, and 303 are inversely proportional to the heights DH1, DH2, and DH3 of the data storage units 360, but the inventive concept is not limited thereto. In another embodiment, even when the widths of the data storage regions 301, 302, and 303 are narrowly formed, the data storage units 360 may be formed to have low heights, and thus the widths of the data storage regions 301, 302, and 303 and the heights DH1, DH2, and DH3 may not have inversely proportional relationship.

Further, total heights of the data storage regions 301, 302, and 303, that is, heights from bottoms of the switching device 340 to tops of the second electrodes 370 may be the same as each other. FIG. 3 illustrates that the switching devices 340, the first electrodes 350, the data storage units 360, and the second electrodes 370 are formed separately in the data storage regions 301, 302, and 303. However, the switching devices 340, the first electrodes 350, and the second electrodes 370, other than the data storage units 360, may not be separately formed in the data storage regions 301, 302, and 303.

The switching device 340 may be formed of any one among a PN diode, a shottky diode, and a MOS transistor. When, the switching device 340 is formed of a diode, the memory cell MC may further include an ohmic contact layer that may improve contact force between the diode and the first electrode 350 formed of a metal material.

Figure 4:
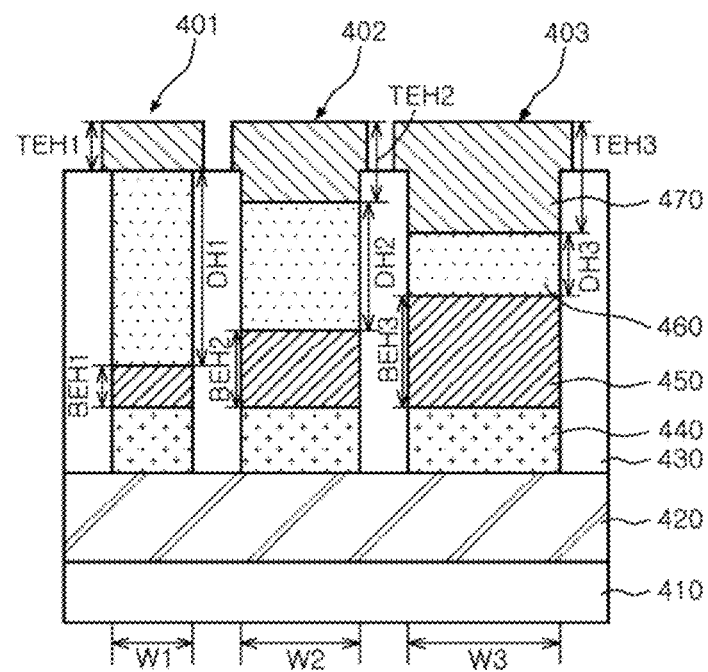
FIG. 4 is a cross-sectional view illustrating a structure of a memory cell of a variable resistance memory apparatus according to an embodiment of the inventive concept.

FIG. 4 is a cross-sectional view illustrating a structure of a memory cell of a variable resistance memory apparatus according to an embodiment of the inventive concept.

Referring to FIG. 4, a memory cell MC of a variable resistance memory apparatus 100 according to an embodiment of the inventive concept may include a plurality of data storage regions. For example, the memory cell MC may include a first data storage region 401, a second data storage region 402, and a third data storage region 403. The embodiment has described that one memory cell MC includes three data storage regions, but the inventive concept is not limited. If necessary, the number of data storage regions included in one memory cell may be controlled to have different values.

The data storage regions 401, 402, and 403 constituting the memory cell MC of the variable resistance memory apparatus 100 according to another embodiment of the inventive concept may have different widths from each other. In other words, the data storage regions 401, 402, and 403 may be formed so that a width W1 of the first data storage region 401, and a width W2 of the second data storage region 402, and a width W3 of the third data storage region 403 become W1<W2<W3.

Each of the data storage regions 401, 402, and 403 may include a word line region 420 that may be formed on a semiconductor substrate 410 to serve as a word line, a switching device 440 (SW) formed on the word line region 420, a first electrode 450 formed on the switching device 440, a data storage unit 460 formed on the first electrode 450, and a second electrode 470 formed on the data storage unit 460. The reference numeral 430 denotes an insulating layer. Here, in the first data storage region 401, the second storage region 402, and the third storage region 403, the first electrodes 450, the data storage units 460, and the second electrodes 470 may be formed to have different heights from each other. For example, referring to FIG. 4, the first electrodes 450 may be formed so that a height BEH1 of the first electrode 450 of the first data storage region 401, a height BEH2 of the first electrode 450 of the second data storage region 402, and a height BEH3 of the first electrode 450 of the third data storage region 403 become BEH1<BEH2<BEH3. The data storage units 460 may be formed so that a height DH1 of the data storage unit 460 of the first data storage region 401, a height DH2 of the data storage unit 460 of the second data storage region 402, and a height DH3 of the data storage unit 460 of the third data storage region 403 become DH1>DH2>DH3. According to the data storage units 460 having the different heights in the data storage regions 401, 402, and 403, the second electrodes 470 may be formed so that a height TEH1 of the second electrode 470 of the first data storage region 401, a height TEH2 of the second electrode 470 of the second data storage region 402, and a height TEH3 of the second electrode 470 of the third data storage region 403 become TEH1<TEH2<TEH3. Here, the data storage unit 460 may be formed of a phase-change material, and the phase-change material may be, for example, GST. Further, total heights of the data storage regions 401, 402, and 403, that is, heights from bottoms of the switching devices 440 to tops of the second electrodes 470 may be the same as each other.

The switching device 440 may be formed of any one among a PN diode, a shottky diode, and a MOS transistor. When, the switching device 330 is formed of a diode, the memory cell MC may further include an ohmic contact layer that may improve contact force between the diode and the first electrode 450 formed of a metal material. Further, the switching devices 440 may not be separately formed in the data storage regions 401, 402, and 403, and thus one switching device 440 may be formed in one memory cell MC.

FIGS. 5A to 5E are cross-sectional views sequentially illustrating a method of manufacturing a memory cell of a variable resistance memory apparatus according to an embodiment of the inventive concept.

Figure 5A:
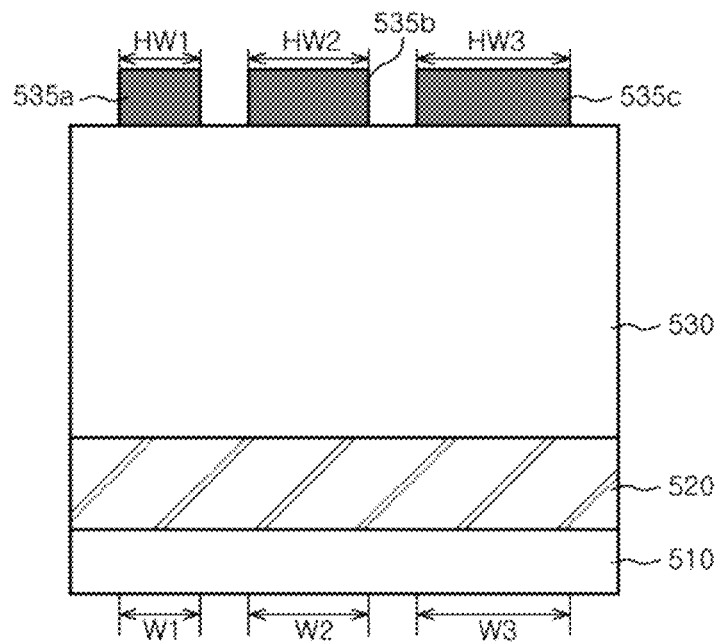
FIGS. 5A to 5E are cross-sectional views sequentially illustrating a method of manufacturing a memory cell of a variable resistance memory apparatus according to an embodiment of the inventive concept.

As illustrated in FIG. 5A, a method of manufacturing the memory cell MC of the variable resistance memory apparatus 100 according to an embodiment of the inventive concept include providing a semiconductor substrate 510, and forming a word line region 520 by implanting N type impurities into an upper portion of the semiconductor substrate 510 or forming a metal material on the semiconductor substrate 510. An insulating layer 530 is formed on the word line region 520, and then a plurality of hard masks 535a, 535b, and 535c corresponding to the number of data storage regions are formed on the insulating layer 530. The plurality of hard masks 535a, 535b, and 535c formed on the insulating layer 530 may have different widths from each other. For example, a first hard mask 535a having a first width HW1 is formed on a portion of the insulating layer 530, corresponding to a region in which a first data storage region is to be formed, a second hard mask 535b having a second width HW2 is formed on a portion of the insulating layer 530, corresponding to a region in which a second data storage region is to be formed, and a third hard mask 535c having a third width HW3 is formed on a portion of the insulating layer 530, corresponding to a region in which a third data storage region is to be formed. The memory cell may include the data storage regions having different widths from each other according to the hard masks 535a, 535b, 535c having the different widths from each other. In an exemplary embodiment, the widths of the data storage regions may become W1<W2<W3.

Figure 5B:
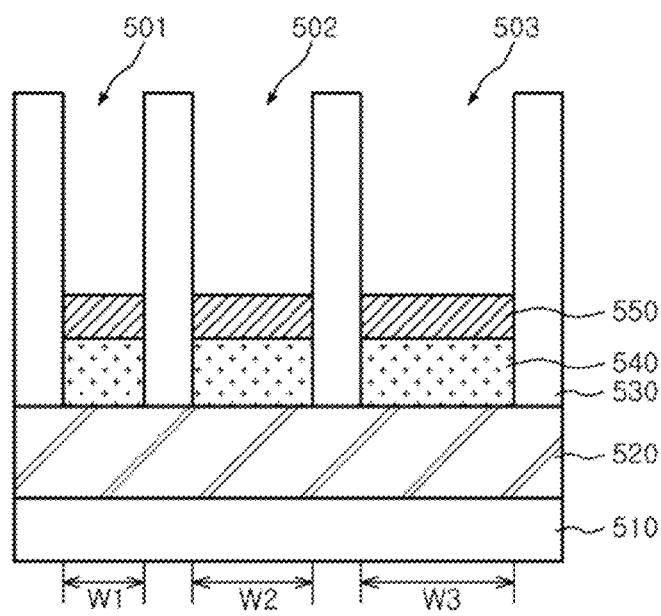

As illustrated in FIG. 5B, a photolithographic process using the hard masks 535a, 535b, and 535c is performed on the insulating layer 530 to form the region in which a first data storage region 501 is to be formed, the region in which a second data storage region 502 is to be formed, and the region in which a third data storage region 503 is to be formed, wherein all of regions expose an upper surface of the word line region 520. Then, a switching device 540 and a first electrode 550 are formed on the exposed upper surface of the word line region 520, in each of the data storage regions 501 to 503. More specifically, a material layer for the switching device 540 is formed on the word line region 520 to bury the regions, and then etched to form the switching device 540 in a bottom of each of the data storage regions 501, 502, and 503. Then, a first electrode material layer is formed on the switching device 540 and then etched to form the first electrode 550 to have a certain height in each of the data storage regions. The switching device 540 may be formed of any one among a PN diode, a shottky diode, and a MOS transistor.

Figure 5C:
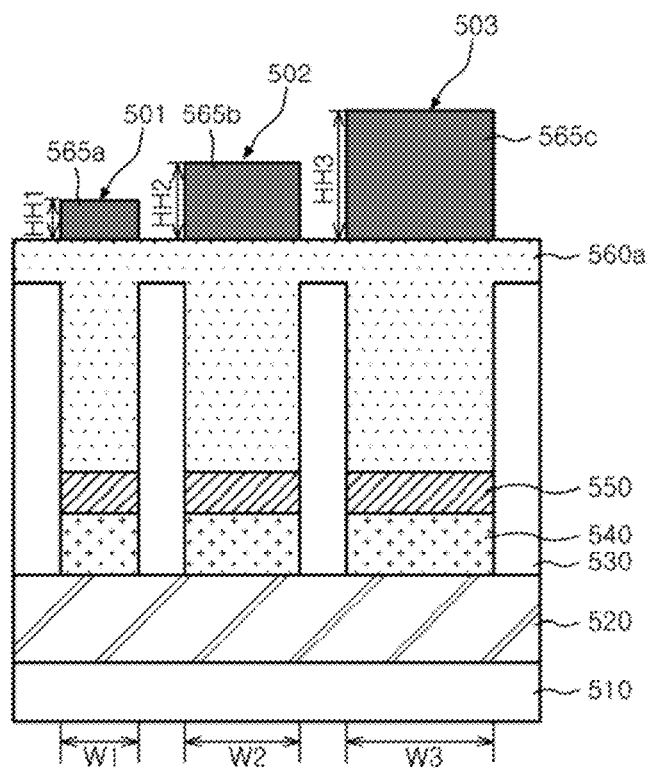

As illustrated in FIG. 5C, a phase-change material layer 560a is formed on the first electrodes 550, to have a height larger than that of the insulating layer 530.

A plurality of hard masks 565a, 565b, and 565c are formed on the phase-change material layer 560a. At this time, the hard masks 565a, 565b, and 565c formed on the phase-change material layer 560a may have the different heights from each other. For example, a fourth hard mask 565a having a first height HH1 is formed on a portion of the phase-change material 560a, corresponding to the first data storage region 501, a fifth hard mask 565b having a second height HH2 is formed on a portion of the phase-change material 560a, corresponding to the second data storage region 502, and a sixth hard mask 565c having a third height HH3 is formed on a portion of the phase-change material 560a, corresponding to the third data storage region 503.

Figure 5D:
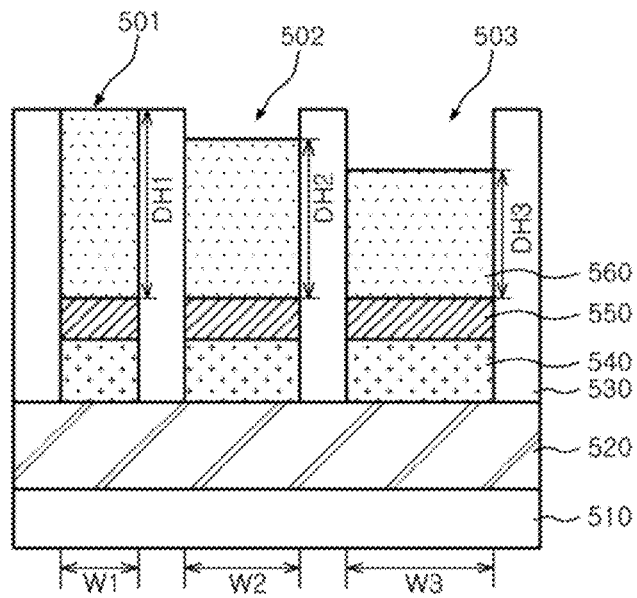

As illustrated in FIG. 5D, the phase-change material layer 560a is etched using the hard masks 565a, 565b, and 565c having different heights from each other to form data storage units 560 having different heights from each other. In an exemplary embodiment, the data storage unit 560 of the first data storage region 501 has a first height DH1, the data storage unit 560 of the second data storage region 502 has a second height DH2, and the data storage unit 560 of the third data storage region 503 has a third height DH3. Therefore, program volumes different from each other even under the same current may be formed to implement a multi-level cell.

Figure 5E:
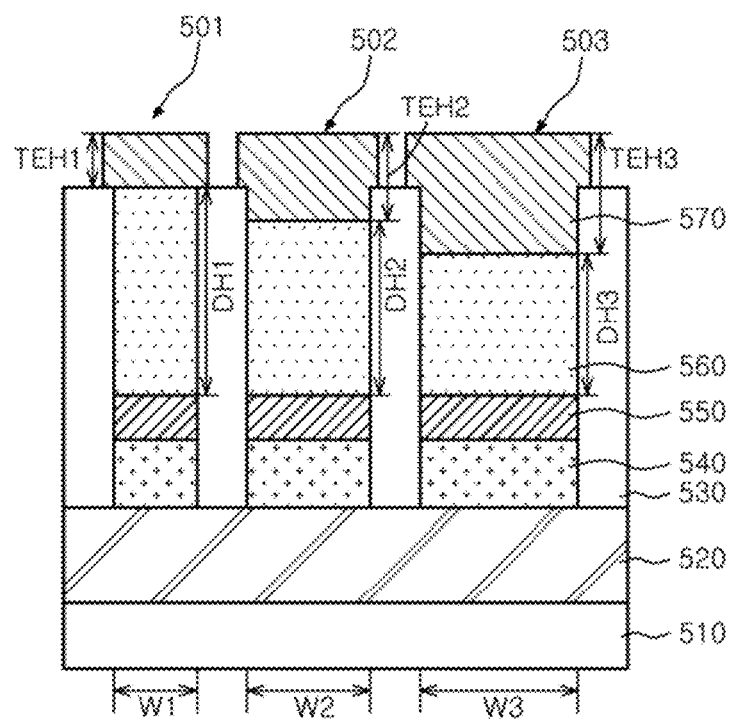

Referring to FIG. 5E, second electrodes 570 having different heights from each other are formed on the data storage units 560 in the data storage regions 501, 502, and 503. At this time, upper surfaces of the second electrodes 570 may be located at the same level. That is, total heights of the data storage regions 501, 502, and 503 are substantially the same. The second electrodes 570 are formed by forming a second electrode material layer on the data storage units 560 in the data storage regions 501, 502, and 503, and planarizing the second electrode material to certain heights. The second electrodes 570 are formed to have different heights from each other in the data storage regions 501, 502, and 503 according to the data storage units 560 having the different heights from each other in the data storage regions 501, 502, and 503. In other words, the second electrode 570 having a first height TEH1 is formed in the first data storage region 501, the second electrode 570 having a second height TEH2 is formed in the second data storage region 503, and the second electrode 570 having a third height TEH3 is formed in the third data storage region 503. In FIG. 5E, the second electrodes 570 are separately formed in the data storage regions 501, 502, and 503, but the inventive concept is not limited thereto. In another exemplary embodiment, one memory cell MC may be formed to have one second electrode.

Further, the first electrodes having the different heights from each other as illustrated in FIG. 4 may be formed using hard masks having different heights from each other in the data storage regions of the memory cell.

As described above, in the variable resistance memory apparatuses 100 according to the embodiments of the inventive concept, a plurality of data storage regions having different widths from each other are formed in a memory cell, and data storage units included in the data storage regions are formed to have different heights from each other. Therefore, program volumes different from each other even under the same current may be formed to implement a multi-level cell.

The above embodiment of the inventive concept is illustrative and not limitative. Various alternatives and equivalents may be possible. The invention is not limited by the embodiment described herein. Nor is the invention limited to any specific type of semiconductor apparatus. Other additions, subtractions, or modifications are obvious in view of the present disclosure and are intended to fall within the scope of the appended claims.

What is claimed is:

1. A variable resistance memory apparatus, comprising:
a plurality of memory cells, each of the memory cells including a plurality of data storage regions,
wherein the plurality of data storage regions include a plurality of data storage units for storing data and the plurality of data storage units have different widths from each other and different heights from each other.

2. The variable resistance memory apparatus of claim 1, each of the plurality of data storage regions includes:
a first electrode formed under one of the data storage units;
a second electrode formed on the one of the data storage units.

3. The variable resistance memory apparatus of claim 1, wherein each of the plurality of data storage units includes a phase-change material.

4. The variable resistance memory apparatus of claim 2, wherein the second electrodes have different heights from each other.

5. A variable resistance memory apparatus, comprising:
a plurality of memory cells,
wherein any one of the plurality of memory cells includes:
a switching device formed on a semiconductor substrate;
a plurality of first electrodes formed on the switching device and having different heights from each other;
a plurality of data storage units formed on respective first electrodes and having different heights from each other; and
a plurality of second electrodes formed on respective data storage units and having different heights from each other.

6. The variable resistance memory apparatus of claim 5, wherein the plurality of data storage units are formed to have different widths from each other.

7. The variable resistance memory apparatus of claim 6, wherein each of the data storage units is formed of a phase-change material.

8. The variable resistance memory apparatus of claim 5, wherein when heights of the first electrodes are increased, heights of respective data storage units are reduced.

9. The variable resistance memory apparatus of claim 5, wherein when heights of the data storage units are increased, heights of respective second electrodes are reduced.

10. A variable resistance memory apparatus, comprising:
a memory cell array including a plurality of memory cells, each of the memory cells including a plurality of data storage regions having different widths from each other; and
a control circuit suitable for controlling data to be input to or output from each of the memory cells according to a command input from outside,
wherein each of the plurality of data storage regions includes:
a switching device formed on a semiconductor substrate;
a first electrode formed on the switching device;
a data storage unit formed on the first electrode; and
a second electrode formed on the data storage unit, and wherein the plurality of data storage units have different heights from each other and the plurality of first electrodes have different heights from each other.

11. The variable resistance memory apparatus of claim 10, wherein each of the data storage units is formed of a phase-change material.

12. The variable resistance memory apparatus of claim 10, wherein the plurality of second electrodes have different heights from each other.

* * * * *